United States Patent [19]

Ozimek et al.

[11] Patent Number: 5,340,420
[45] Date of Patent: Aug. 23, 1994

[54] METHOD FOR BONDING A COLOR SEPARATION FILTER TO AN IMAGE SENSOR

[75] Inventors: Edward J. Ozimek, Penfield; Terry Tarn, Pittsford, both of N.Y.

[73] Assignee: Eastman Kodak Company, Rochester, N.Y.

[21] Appl. No.: 10,121

[22] Filed: Jan. 28, 1993

[51] Int. Cl.[5] .............................................. B32B 31/00
[52] U.S. Cl. ................................. 156/64; 156/275.5; 156/275.7; 156/295; 156/299; 156/330
[58] Field of Search ................ 156/299, 275.5, 275.7, 156/330, 280, 285, 64, 295; 250/208.1; 358/213.11, 212, 229

[56] References Cited

U.S. PATENT DOCUMENTS

| | | | |
|---|---|---|---|
| 4,268,119 | 5/1981 | Hartmann | 350/173 |
| 4,323,918 | 4/1982 | Bendell | 358/50 |
| 4,388,128 | 6/1983 | Ogawa et al. | 156/64 |
| 4,418,284 | 11/1983 | Ogawa et al. | 250/578 |
| 4,523,102 | 6/1985 | Kazufumi et al. | 250/578 |
| 4,622,580 | 11/1986 | Levine | 358/50 |
| 4,661,191 | 4/1987 | Kamio et al. | 156/275.5 |
| 4,835,600 | 5/1989 | Harada et al. | 358/51 |
| 4,853,064 | 8/1989 | Levine | 156/275.5 |

Primary Examiner—Chester T. Barry
Attorney, Agent, or Firm—Raymond L. Owens

[57] ABSTRACT

A method for bonding a color separation filter to an image sensor. The method comprises the steps of dispensing an optical coupling composition on a preselected surface of at least one of the filter and sensor; bonding the filter to the sensor for creating a filter-sensor assembly, by using a predetermined amount of UV curable adhesive at an interface of the filter-sensor assembly; and, dispensing an epoxy along a periphery of the filter-sensor assembly, thereby encapsulating the optical coupling composition at the interface of the filter-sensor assembly.

5 Claims, 1 Drawing Sheet

METHOD FOR BONDING A COLOR SEPARATION FILTER TO AN IMAGE SENSOR

FIELD OF THE INVENTION

This invention relates to a method for bonding a color separation filter to an image sensor.

INTRODUCTION TO THE INVENTION

An important class of solid-state color-image sensors may be fabricated by bonding a first subassembly to a second and independent subassembly, wherein the first subassembly comprises a solid-state image sensor, for example, a charge-coupled device (CCD) having an array of photodetectors, and, the second subassembly comprises a color separation filter, for example, a dichroic separation filter.

SUMMARY OF THE INVENTION

In order to optimize and enhance an operation of such a solid-state color-image sensor, we are critically analyzing the fabrication step that comprises bonding the image sensor to the color separation filter.

To this end, we note that the bonding step comprehends at least a three-fold process. First, the bonding step can participate in an optical alignment process between the image sensor and the filter. Second, the bonding step can mechanically stake the image sensor to the filter. Third, the bonding step may be a determinant of the qualities of an optical interface between the image sensor and the filter.

In order to realize the stated objective of an optimal bond in the fabrication of the sensor-filter, we specify that a bonding technique provide acceptable overall mechanical stability, preserve a precision optical alignment between the sensor and filter, and provide a desired optical interface so that optical characteristics like resolution, index of refraction and clarity can remain invariant and stable over a long period of time.

We have determined that known bonding techniques may be in only partial satisfaction of the stated objective. For example, one important bonding technique comprises a step of fixing the filter to the sensor by using an optical adhesive. The optical adhesive is then cured, typically by using thermal and/or ultra-violet light means. We discern a potential problem in this bonding technique, however, because the stability of the adhesive's optical properties may be vitiated, especially after exposure to intense ultra-violet light and over a period of time, thereby impairing the desired qualities of the optical interface between the sensor and the filter.

We have now discovered a novel method for fabricating a solid-state color-image sensor that can address and solve this problem. The novel method has the critical advantage of eliminating the negative aspects that we discern with respect to the employment of known optical adhesives, so that they can now be used in a beneficial manner. Additionally, the novel method has advantages including providing a mechanically stable and robust bonding between the sensor and the filter, and a bonding, moreover, that can preserve a required optical alignment and optical interface between these subassemblies.

In one aspect, the present invention provides a method for bonding a color filter to an image sensor, the method comprising the steps of:

1) dispensing an optical coupling composition on a preselected surface of at least one of the filter and sensor;
2) bonding the filter to the sensor for creating a filter-sensor assembly, by using a predetermined amount of UV curable adhesive at an interface of the filter-sensor assembly;
and
3) dispensing an epoxy along a periphery of the filter-sensor assembly, thereby encapsulating the optical coupling composition at the interface of the filter-sensor assembly.

In another aspect, the present invention provides a method for bonding a color filter to an image sensor, the method comprising the steps of:

1) securing the sensor in a holder;
2) uniformly coating a surface of the sensor with an optical coupling composition;
3) positioning the filter over the sensor using a vacuum chuck;
4) optically aligning the filter to the sensor;
5) staking the filter to the sensor by using a predetermined amount of UV curable adhesive at either end of the filter;
6) dispensing an epoxy along a periphery of the filter-sensor assembly for bonding the assembly together;
and
7) encapsulating the optical coupling composition at an interface of said filter-sensor assembly.

BRIEF DESCRIPTION OF THE DRAWING

The invention is illustrated in the accompanying drawing, in which FIGS. 1A,B show a side-view and a perspective view respectively of a bonding of a dichroic filter to an image sensor in accordance with a method of the present invention.

DETAILED DESCRIPTION OF THE INVENTION

Figure 1A:
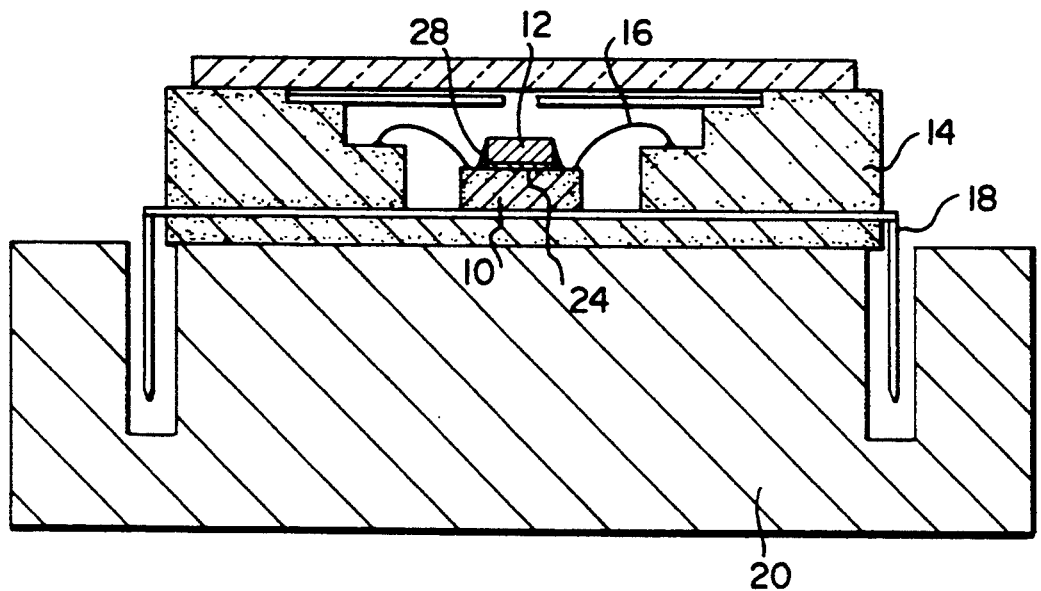
Figure 1B:
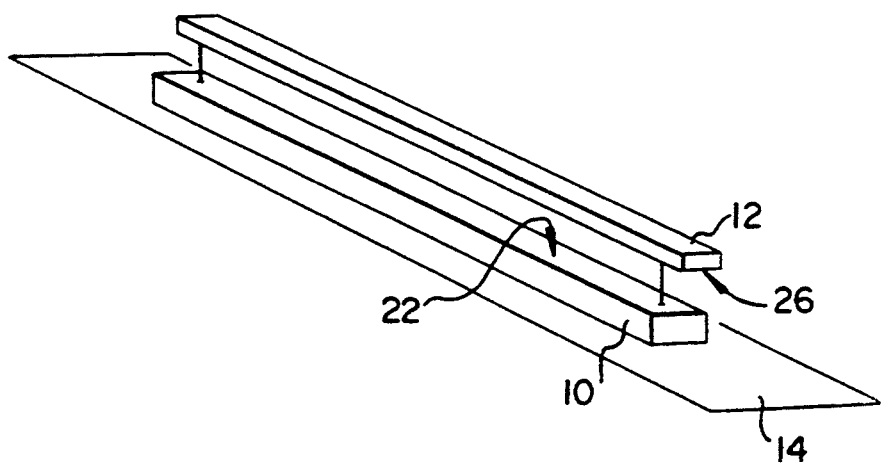

Attention is now directed to FIGS. 1A,B, which may be used to illustrate various aspects of the present invention.

An image sensor 10 preferably comprising a CCD formed in a silicon die and having an array of photodetectors is to be bonded to a color separation filter 12, for example, a dichroic filter.

In steps preliminary to the method of the present invention proper, the image sensor 10 may be bonded to a carrier 14 by conventional methods. Wire bonds 16 may be electrically connected between the image sensor 10 and the carrier 14, and outside electrical leads 18 may be connected to terminals of the carrier 14; these connections also being established by conventional means. Further, active photodetectors of the image sensor 10 may be precision optically aligned to the color separation filter 12, preferably by using targets which have been lithographically reproduced on both the image sensor 10 and the color separation filter 12.

The color separation filter 12 is now preferably placed over the image sensor 10 and optically coupled to it i.e., bonded, in accordance with the following preferred steps of the method of the present invention. (Note that it is necessary to execute the following steps in as clean an environment as possible, due to the micron size pixel features of the image sensor 10.)

A first step preferably comprises placing and securing the image sensor 10 in a conventional holding fixture 20, taking care that no foreign matter is present on the surface of the silicon die.

Step 2 comprises dispensing and preferably uniformly coating a top 22 of the silicon die with an optical coupling composition 24. By "uniformly", we mean preferably without angles or wedges, and with a thickness preferably of 3 to 4 mils. An optical coupling composition 24 is preferred for the present method, since it is not cross-linked by heat or UV light, and can therefore remain stable over a long period of time. A preferred optical coupling composition 24 has an index of refraction that matches the index of refraction of the color separation filter 12, and therefore provides a desirable optical interface between the image sensor 10 and the color separation filter 12. A suitable and preferred such optical coupling composition 24 is available from Dow Corning Corporation, sold as product Q2-3067.

Note that the step 2 process of dispensing a uniform amount of the optical coupling composition 24 along the top 22 of the silicon die, may be facilitated by employment of a dispensing mechanism, such as a West Bond Model 7200A pick and place machine.

Step 3 of the present invention preferably comprises placing or positioning the dichroic filter 12 over the image sensor 10, for example, by way of a vacuum pick-up tool or the like, and carefully placing the color separation filter 12 down onto the silicon die so as to induce a uniform spreading of the optical coupling composition 24 beneath the color separation filter 12.

Step 4 comprises optically aligning the color separation filter 12 and the image sensor 10, preferably by way of alignment targets, as is well known in the art.

Step 5 preferably subsumes a preliminary step of checking the image sensor 10-color separation filter 12 assembly, as heretofore assembled, for debris or bubble entrapment, and henceforth staking the color separation filter 12 in place using a small drop e.g., less than a millimeter in diameter, of a conventional UV curable adhesive 26, or the like, preferably at each end of the color separation filter 12. A suitable such UV curable adhesive is available from Norland Optical Adhesive, type 83 H.

Steps 6 and 7 preferably comprise dispensing a curable epoxy along a periphery of the image sensor 10-color separation filter 12 assembly, for bonding and encapsulating this assembly. In particular, this action encapsulates the image sensor 10-color separation filter 12 interface, thereby containing the optical coupling composition 24 in the interface, and keeping it in its original state. A black epoxy may be employed, and provides an advantage of additional performance, by keeping unwanted scattered light from entering the image sensor 10. A suitable epoxy is a conventional epoxy like Epotek H-62.

A summary of the advantages of the present method includes the following points.

An optical interface can be made using a high clarity, good resolution material possessing an index of refraction closely matched to that of the color separation filter 12.

Encapsulating the optical coupling composition 24 within the silicon die-color separation filter interface, can maintain the optical properties of the fluid for an extended period of time.

The employment of the epoxy can provide a moisture resistant, high opacity coating which can contribute to the performance of the image sensor 10, by eliminating scattered light which may enter the image sensor 10 through a side wall of the color separation filter 12. Moreover, deleterious yellowing effects, which may be produced by exposure to high intensity UV light, or which can occur with time, can be substantially eliminated, thereby enhancing the performance of the image sensor 10.

What is claimed:

1. A method for bonding a color separation filter to an image sensor, the method comprising the steps of:
   1) dispensing an optical coupling composition that is not cross-linked by heat or ultraviolet (UV) radiation on a preselected surface of at least one of the filter and sensor;
   2) placing the filter on the sensor so as to induce a uniform spreading of the optical coupling composition between the filter and sensor;
   3) staking the filter to the sensor by placing a predetermined amount of UV curable adhesive at a discrete point at an interface of the filter and sensor; and
   4) dispensing an epoxy along a periphery of the interface of the filter end the sensor, thereby bonding the filter to the sensor and encapsulating the optical coupling composition at the interface of the filter and sensor.

2. A method according to claim 1, wherein step 1 comprises coating a surface of the sensor with the optical coupling composition, said coating comprising a uniform layer of 3 to 4 mils.

3. A method according to claim 1, wherein step 2 comprises using a drop of UV curable adhesive less than a millimeter in diameter.

4. A method according to claim 1, wherein step 3 comprises dispensing a black epoxy.

5. A method for bonding a color separation filter to an image sensor, the method comprising the steps of:
   1) securing the sensor in a holder;
   2) uniformly coating a surface of the sensor with an optical coupling composition that cross-linked by heat or ultraviolet (UV) radiation;
   3) positioning the filter over the sensor using a vacuum chuck;
   4) optically aligning the filter to the sensor and placing the filter on the sensor;
   5) staking the filter to the sensor by using a predetermined amount of UV curable adhesive at either end of an interface of the filter and sensor;
   6) dispensing an epoxy along a periphery of the interface of the filter and sensor to bond the filter and the sensor together and encapsulate the optical coupling composition at the interface of the filter and sensor.

* * * * *